United States Patent
Kannari

(10) Patent No.: US 9,287,679 B2
(45) Date of Patent: Mar. 15, 2016

(54) METHOD OF CONTROLLING TEMPERATURE OF SEMICONDUCTOR LASER, TEMPERATURE CONTROL DEVICE OF SEMICONDUCTOR LASER AND NON-TRANSITORY COMPUTER-READABLE MEDIUM

(71) Applicant: Fujitsu Optical Components Limited, Kawasaki-shi, Kanagawa (JP)

(72) Inventor: Kenta Kannari, Sapporo (JP)

(73) Assignee: FUJITSU OPTICAL COMPONENTS LIMITED, Kawasaki (JP)

( * ) Notice: Subject to any disclaimer, the term of this patent is extended or adjusted under 35 U.S.C. 154(b) by 0 days.

(21) Appl. No.: 14/250,780

(22) Filed: Apr. 11, 2014

(65) Prior Publication Data

US 2014/0341240 A1    Nov. 20, 2014

(30) Foreign Application Priority Data

May 16, 2013   (JP) ................................. 2013-104532

(51) Int. Cl.
  *H01S 3/04*   (2006.01)
  *H01S 5/024*  (2006.01)
  *H01S 5/06*   (2006.01)
  *H01S 5/068*  (2006.01)

(52) U.S. Cl.
  CPC .............. *H01S 5/024* (2013.01); *H01S 5/0612* (2013.01); *H01S 5/0617* (2013.01); *H01S 5/06804* (2013.01)

(58) Field of Classification Search
  CPC ........ H01S 5/024; H01S 3/04; H01S 5/06804
  USPC .......................................... 372/34, 35; 385/130
  See application file for complete search history.

(56) References Cited

U.S. PATENT DOCUMENTS

| | | | | |
|---|---|---|---|---|
| 5,287,367 A * | 2/1994 | Yanagawa | ........................ | 372/31 |
| 5,926,495 A * | 7/1999 | Guch, Jr. | ........................ | 372/75 |
| 6,400,739 B1 * | 6/2002 | Auracher | ........................ | 372/32 |
| 6,493,125 B1 * | 12/2002 | Tanaka et al. | ................... | 398/95 |
| 8,275,011 B2 * | 9/2012 | Arai et al. | ........................ | 372/34 |
| 2002/0009105 A1 * | 1/2002 | Matsumoto | ..................... | 372/34 |
| 2005/0281300 A1 * | 12/2005 | Li et al. | ...................... | 372/38.04 |
| 2011/0170856 A1 * | 7/2011 | Kannari et al. | .................... | 398/2 |

FOREIGN PATENT DOCUMENTS

| | | |
|---|---|---|
| JP | 7-335958 | 12/1995 |
| JP | 2002-299753 | 10/2002 |
| JP | 2009-43080 | 2/2009 |

* cited by examiner

*Primary Examiner* — Tuan Nguyen
(74) *Attorney, Agent, or Firm* — Staas & Halsey LLP

(57) ABSTRACT

A method of controlling a temperature of a semiconductor laser includes: controlling a supply current so that a temperature of a temperature control element is changed to a target temperature, the temperature control element controlling a temperature of the semiconductor laser by a temperature changing according to the supply current supplied to the temperature control element; and performing a control for maintaining a calculated value calculated by a digital filter at a threshold when it is detected that the calculated value reaches the threshold, the calculated value being the supply current for achieving the target temperature, the threshold being equal to or less than an output limit of the digital filter.

21 Claims, 16 Drawing Sheets

(a)

(b)

US 9,287,679 B2

METHOD OF CONTROLLING TEMPERATURE OF SEMICONDUCTOR LASER, TEMPERATURE CONTROL DEVICE OF SEMICONDUCTOR LASER AND NON-TRANSITORY COMPUTER-READABLE MEDIUM

CROSS-REFERENCE TO RELATED APPLICATION

This application is based upon and claims the benefit of priority of the prior Japanese Patent Application No. 2013-104532, filed on May 16, 2013, the entire contents of which are incorporated herein by reference.

FIELD

A certain aspect of embodiments described herein relates to a method of controlling a temperature of a semiconductor laser, a temperature control device of a semiconductor laser and a non-transitory computer-readable medium.

BACKGROUND

Japanese Patent Application Publications No. 07-335958, No. 2009-43080 and No. 2002-299753 disclose a control of a temperature of a semiconductor laser with use of a temperature control element such as a peltier element.

However, when the temperature control is performed, it may take a long time to change a characteristic of the semiconductor laser to a desirable one.

SUMMARY

According to an aspect of the present invention, there is provided a method of controlling a temperature of a semiconductor laser comprising: controlling a supply current so that a temperature of a temperature control element is changed to a target temperature, the temperature control element controlling a temperature of the semiconductor laser by a temperature changing according to the supply current supplied to the temperature control element; and performing a control for maintaining a calculated value calculated by a digital filter at a threshold when it is detected that the calculated value reaches the threshold, the calculated value being the supply current for achieving the target temperature, the threshold being equal to or less than an output limit of the digital filter.

According to another aspect of the present invention, there is provided a method of controlling a temperature of a semiconductor laser comprising: controlling a supply current so that a temperature of a temperature control element is changed to a target temperature, the temperature control element controlling a temperature of the semiconductor laser by a temperature changing according to the supply current supplied to the temperature control element; and switching a control method of the temperature control element to another control method when it is detected that a calculated value calculated by a digital filter reaches an output limit of the digital filter, the calculated value being the supply current for achieving the target temperature.

DESCRIPTION OF EMBODIMENTS

Figure 1:
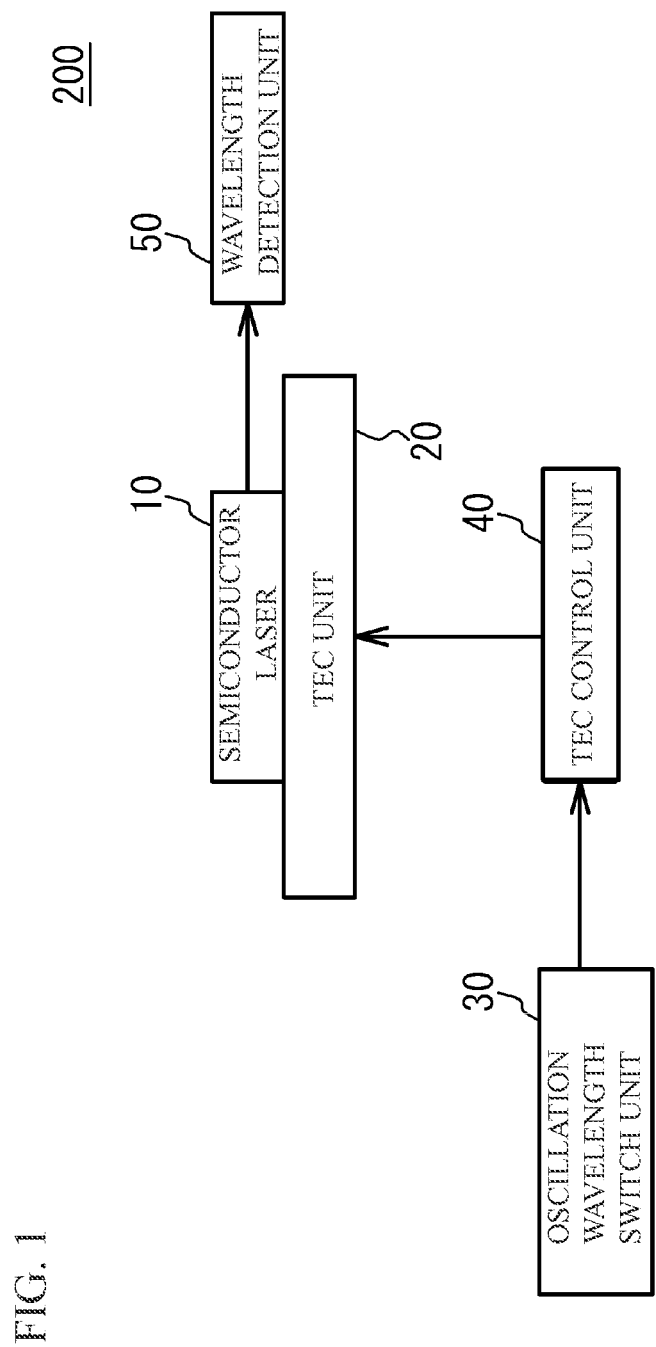
FIG. 1 illustrates a block diagram of an overall structure of a semiconductor laser device.

A description will be given of a semiconductor laser device before describing embodiments. FIG. 1 illustrates a block diagram of an overall structure of a semiconductor laser device 200. The semiconductor laser device 200 has a semiconductor laser 10, a TEC (Thermoelectric cooler) unit 20, an oscillation wavelength switch unit 30, a TEC control unit 40, a wavelength detection unit 50 and so on.

The semiconductor laser 10 is a wavelength tunable laser that is capable of selecting a wavelength that is set from a plurality of oscillation wavelengths and oscillating at the selected wavelength. The oscillation wavelength of the semiconductor laser 10 is determined by a temperature of the semiconductor laser 10 or the like. The TEC unit 20 has a temperature control element for controlling the temperature of the semiconductor laser 10. The oscillation wavelength switch unit 30 is a device for switching the oscillation wavelength of the semiconductor laser 10. The TEC control unit 40 is a controller for controlling the TEC unit 20 so that the semiconductor laser 10 oscillates at the wavelength that is set by the oscillation wavelength switch unit 30. The wavelength detection unit 50 is a device for detecting the oscillation wavelength of the semiconductor laser 10.

The TEC control unit 40 controls the TEC unit 20 based on a detection result of the wavelength detection unit 50 after controlling the TEC unit 20 so that the oscillation wavelength of the semiconductor laser 10 corresponds to a wavelength that is set by the oscillation wavelength switch unit 30. A temperature control of the semiconductor laser 10 of the followings is a control performed by the TEC control unit 40 so that the oscillation wavelength of the semiconductor laser 10 corresponds to the wavelength that is set by the oscillation wavelength switch unit 30, and a control until a control based on the detection result of the wavelength detection unit 50 starts.

Figure 2:
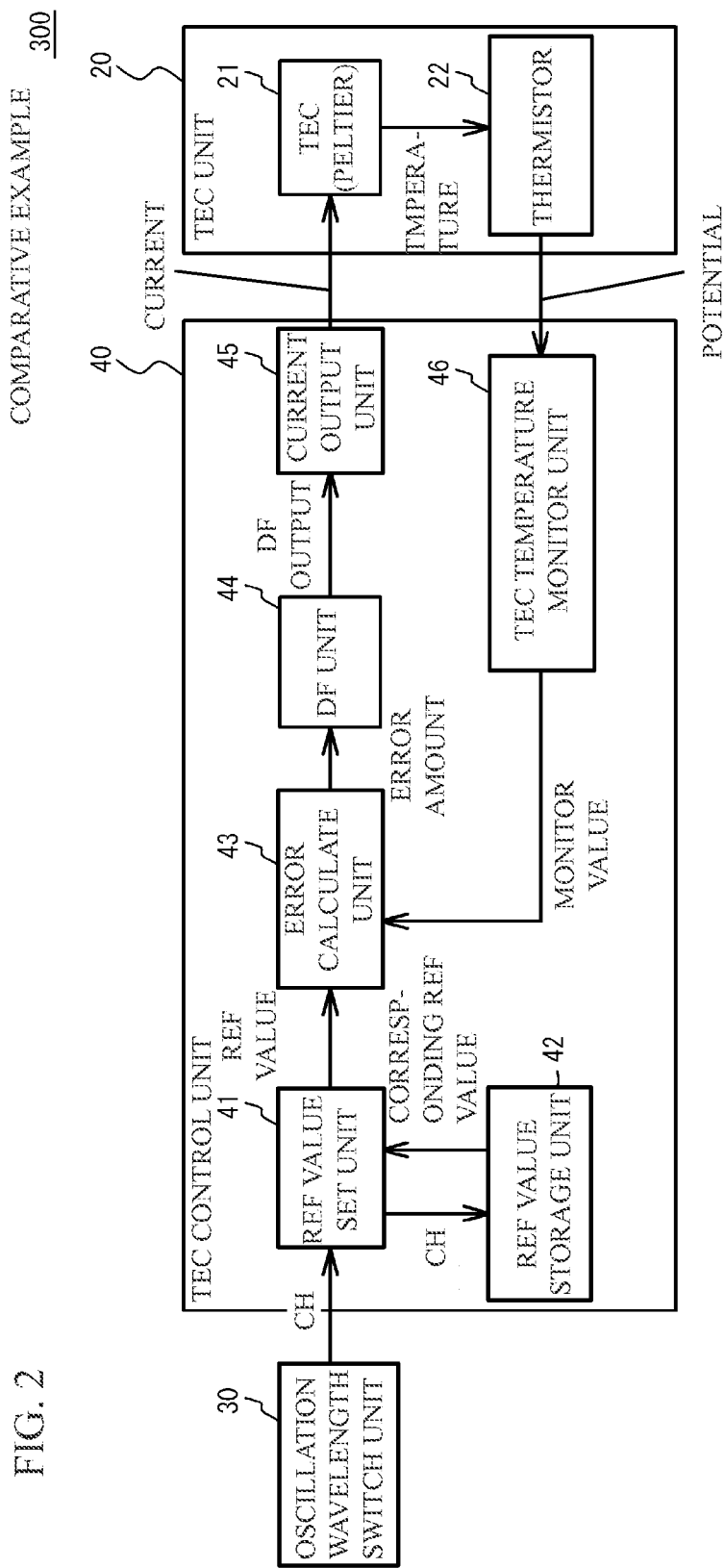
FIG. 2 illustrates a block diagram of a structure of a temperature control device in accordance with a comparative example.

Next, a description will be given of a temperature control device of a semiconductor laser of the semiconductor laser device 200. FIG. 2 illustrates a block diagram of a structure of a temperature control device 300 in accordance with a comparative example. As illustrated in FIG. 2, the TEC unit 20, the oscillation wavelength switch unit 30 and the TEC control unit 40 act as the temperature control device 300.

The TEC unit 20 has a TEC (Thermoelectric cooler) 21 such as a peltier element, a thermistor 22 and so on. The TEC 21 is a temperature control element for controlling the temperature of the semiconductor laser 10 by a temperature changing according to a supplied current. The thermistor 22 is a sensor for detecting a temperature of the TEC 21 (TEC temperature), and indirectly detects the temperature of the semiconductor laser 10. The thermistor 22 converts the detected TEC temperature into a voltage, and outputs an electrical potential to the TEC control unit 40. The TEC control unit 40 has a Ref value set unit 41, a Ref value storage unit 42, an error calculate unit 43, a DF (Digital Filter) unit 44, a current output unit 45 and a TEC temperature monitor unit 46 and so on.

The oscillation wavelength switch unit 30 transmits a desirable wavelength for a light emission to the TEC control unit 40. The Ref value storage unit 42 stores a target temperature for achieving each set wavelength channel (hereinafter referred to as a Ref value). The Ref value set unit 41 reads a Ref value according to the set wavelength channel received from the oscillation wavelength switch unit 30 from the Ref value storage unit 42 and transmits the Ref value to the error calculate unit 43.

The error calculate unit 43 compares the Ref value received from the Ref value set unit 41 with a monitor temperature received from the TEC temperature monitor unit 46, and thereby calculates an error amount (=the Ref value−the monitor temperature). The DF unit 44 is a digital filter such as an IIR (Infinite Impulse Response) filter, calculates an amount of output current supplied to the TEC 21 based on the error amount (correction amount), and outputs the amount of output current to the current output unit 45 as a DF output. The current output unit 45 outputs a current corresponding to the DF output to the TEC unit 20. The TEC temperature monitor unit 46 detects the TEC temperature based on an output potential of the thermistor 22, and inputs the detected value into the error calculate unit 43 as a monitor value.

When the semiconductor laser 10 emits a light having a desirable optical output power and a desirable wavelength and the emitting is kept, it is necessary to keep an inner temperature of the semiconductor laser 10 and a temperature of a photo diode for optical-output-monitoring constant. And so, the temperature control device 300 performs a feedback control with use of the temperature monitoring of the thermistor 22 so that the TEC temperature corresponds to a target temperature.

Figure 3:
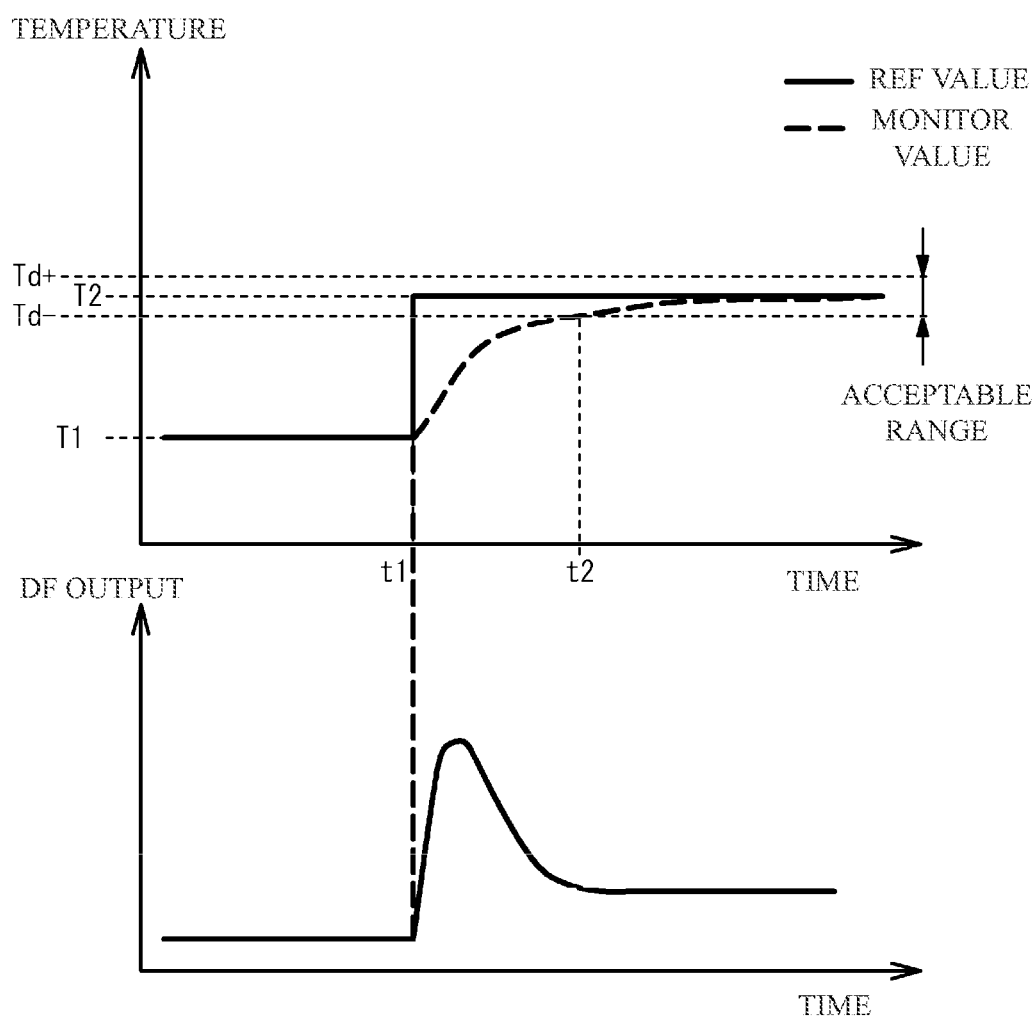
FIG. 3 illustrates an aspect until a temperature of a TEC converges to a target temperature with use of a time axis.

FIG. 3 illustrates an aspect until the temperature of the TEC 21 converges to a target temperature with use of a time axis. In FIG. 3, a horizontal axis indicates a time, and a vertical axis of an upper graph indicates a temperature, and a vertical axis of a lower graph indicates a DF output (amount of output current calculated by the DF unit 44). As illustrated in FIG. 3, the error calculate unit 43 outputs an error amount to the DF unit 44, when the Ref value is changed into T2 (=t1) under a condition that the monitor value is stable at T1 (<t1). The DF unit 44 outputs a DF output based on the error amount. Thus, the current output unit 45 outputs a current for achieving the DF output to the TEC unit 20. This results in a changing of a current flowing into the TEC unit 20 at constant. On the other hand, the error calculate unit 43 sets an error amount threshold (a plus side threshold Td+, a minus side threshold Td−) and determines whether the temperature converges. In the example of FIG. 3, it is determined that the temperature converges at the t2 when the temperature of the TEC 21 reaches an acceptable temperature convergence range. The time [t2−t1] is a temperature convergence time. That is, the temperature convergence time is a time until the temperature of the TEC 21 reaches a predetermined temperature (it is determined that the temperature convergence is finished) after the temperature control of the TEC 21 starts.

Regarding the light emission of the semiconductor laser 10, a time until an output wavelength is stabilized is determined based on a specification. It is preferable that a temperature convergence is designed in accordance with the specification. Recently, a reduction in a starting time (the starting time includes the above-mentioned temperature convergence time) is desired in addition to high accuracy of the temperature control. These elements are necessary for improvement in production quality. In the temperature control of the TEC, a PI (Proportional Integral) control or a PID (Proportional Integral Derivative) control of an IIR (Infinite Impulse Response) filter, in which an estimation of a starting time of various feedback controls is easy, are normally used. The control method can be converted into an analog model. A phase margin or the like can be designed with use of a Bode's line map. Therefore, the control method is often used.

Figure 4A:
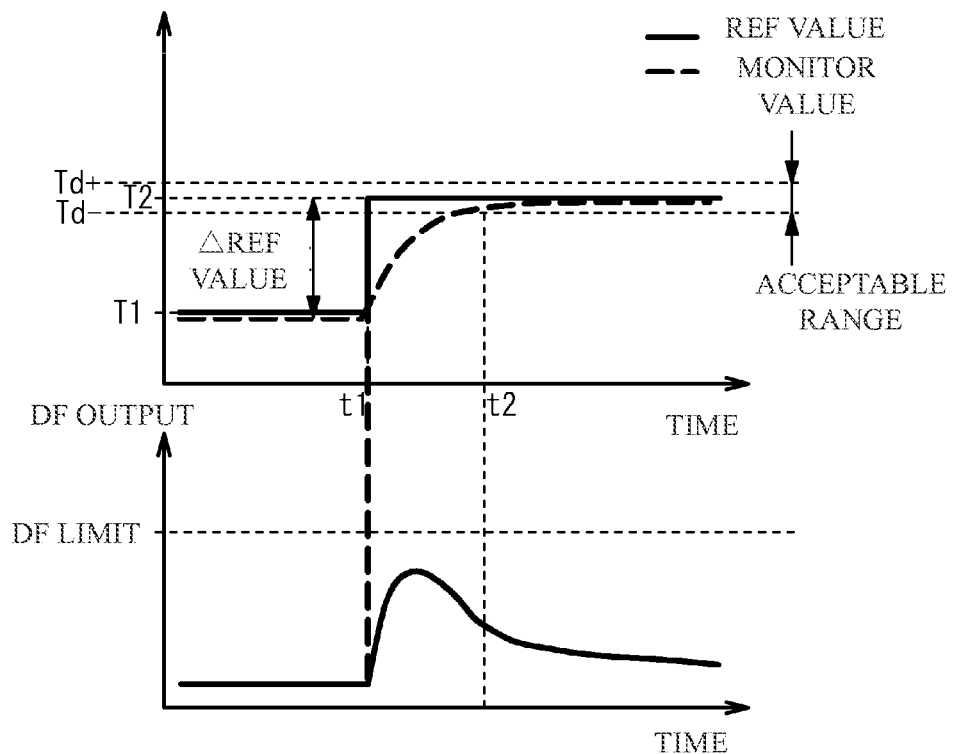
FIG. 4A and FIG. 4B illustrate a phenomenon in which a temperature convergence is extremely delayed under a given condition.
Figure 4B:
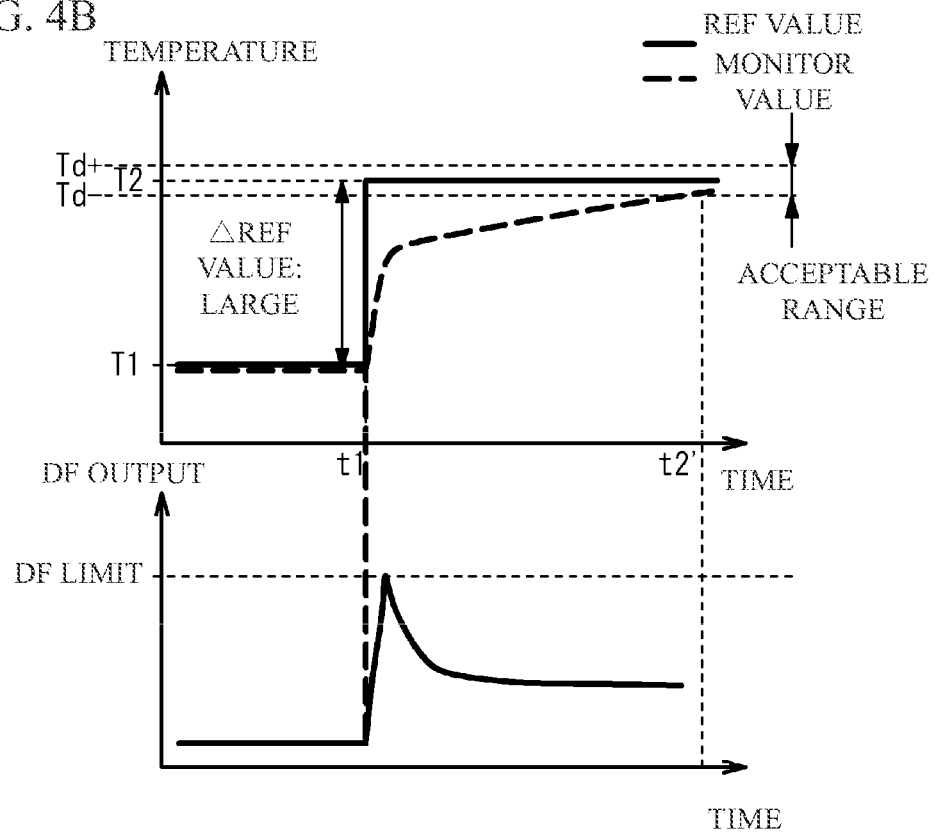

FIG. 4A and FIG. 4B illustrate a phenomenon in which the temperature convergence is extremely delayed. It is preferable that the temperature is controlled with high accuracy in order to control a wavelength with high accuracy. It is preferable that a loop gain is enlarged in order to control the temperature with high accuracy. When the loop gain is enlarged, a current provided to the TEC 21 is enlarged, and the current exceeds an allowed value of the semiconductor laser 10. In this case, the semiconductor laser 10 may be broken. Therefore, a protective limit (DF output limit) is determined in the DF output of the DF unit 44.

However, when the DF output reaches the DF output limit in the middle of the temperature control as illustrated in FIG. 4B, the DF output does not remain at the DF output limit, and the DF output is rapidly reduced after the DF output reaches the DF output limit, with respect to the IIR filter. This is because the DF output does not increase to a primary value, and a component proportional to the error amount continuously decreases. This results in an inconsistency in a feedback loop, rapid decrease of the DF output that is sum of the above-mentioned values, and a reduction of the gain.

When the gain is reduced, an appropriate temperature control is not achieved. Thereby, the temperature convergence time is extremely delayed ([t2−t1]<<[t2'−t1]). t2' is a time when the temperature of the TEC 21 reaches the acceptable temperature convergence range. When a feedback control is performed in a range where the DF output does not reach the DF output limit, it is possible to convert the digital filter to an analog model for performing an optimal temperature control and to determine a design value so that the temperature convergence time is the smallest. However, when the DF output exceeds the DF output limit, the gain is reduced. It is therefore preferable that a well thought control is performed in a region where the DF output is equal to or less than the DF output limit.

Next, a description will be given of a structure for controlling the DF output in a range that is equal to or less than the DF output limit. There is a method of changing the Ref value in stages as a method of controlling the DF output in the range that is equal to or less than the DF output limit. For example, the Ref value set unit 41 does not change a laser temperature for achieving a setting wavelength to a final target value in a single stage but sets from a current value to a final target value in stages under a predetermined condition.

Figure 5A:
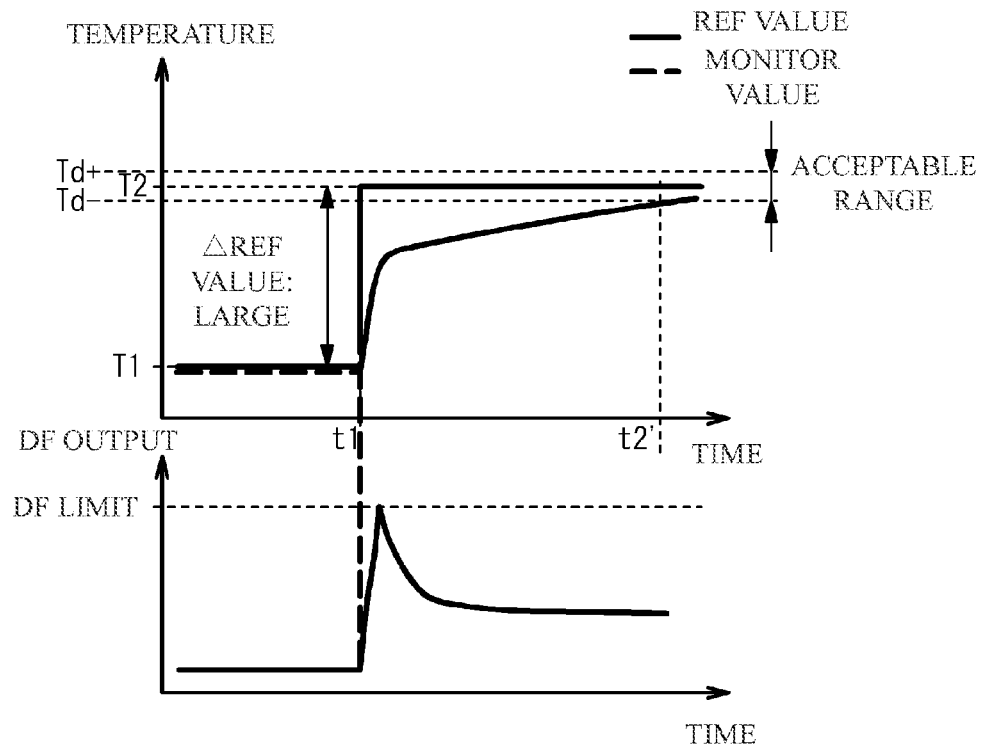
FIG. 5A and FIG. 5B illustrate an effect of a temperature convergence time when a Ref value is changed in three stages.
Figure 5B:
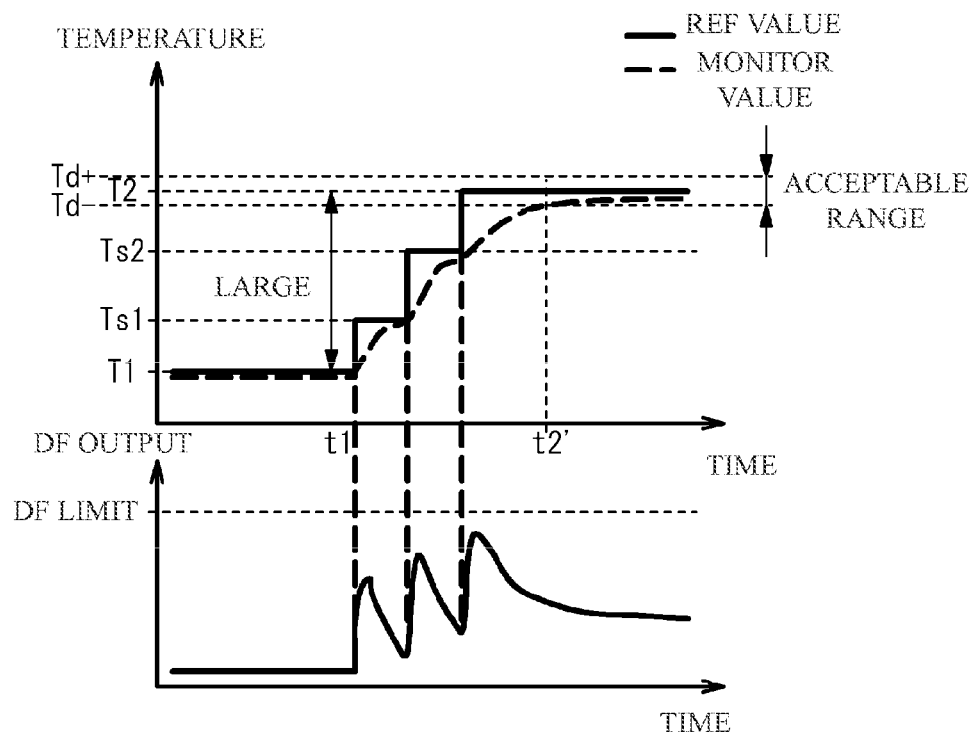

FIG. 5A and FIG. 5B illustrate an effect of reduction of the temperature convergence time when the Ref value is changed in three stages. In FIG. 5A, the Ref value is changed in a single stage, DF output reaches the DF output limit, and from the reaching, the temperature convergence is delayed. In contrast, in FIG. 5B, the Ref value is changed in stages (T1→Ts1→Ts2→Ts3=T2'). The error amount is smaller than a case where the Ref value is changed to the final target value in a single stage. An instant DF output is also reduced. And, the DF output does not reach the DF output limit. This allows the time shortening of the temperature convergence (t2"<t2').

Figure 6A:
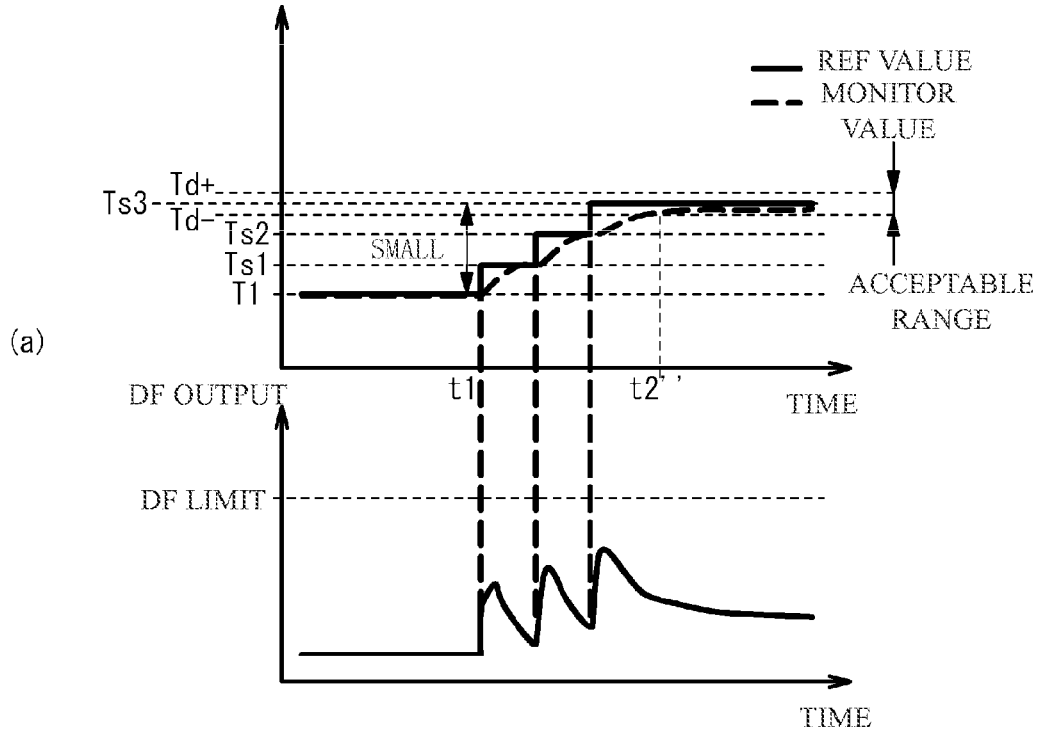
FIG. 6A and FIG. 6B illustrate a new problem in a case where a Ref value is changed in stages.
Figure 6B:
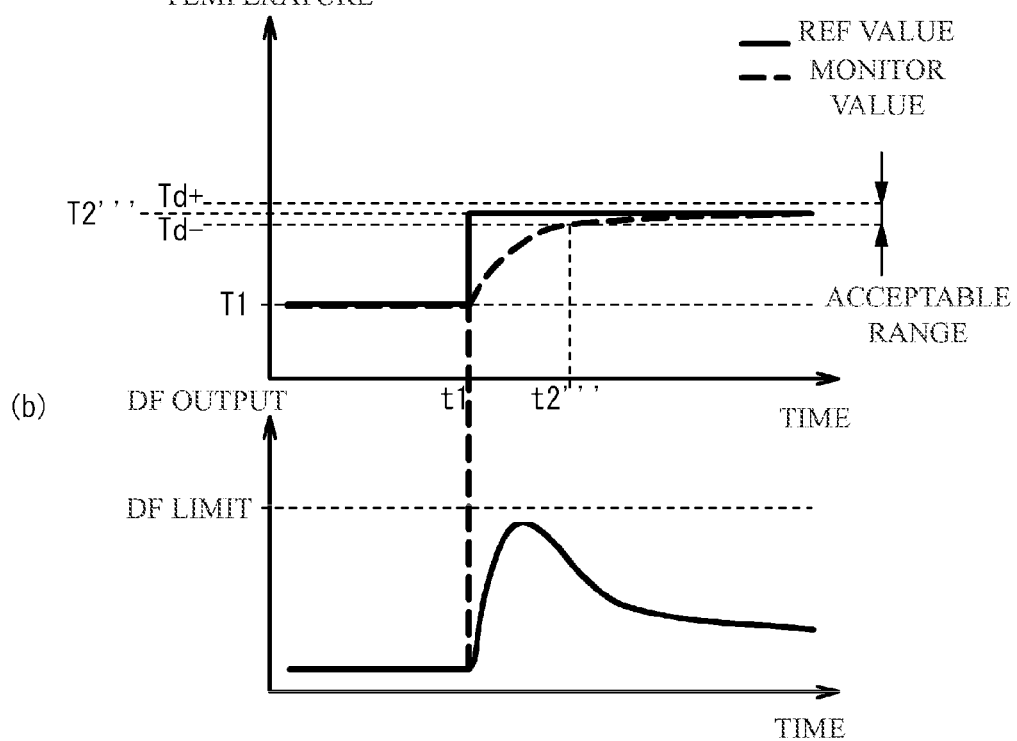

However, in this case, a new problem may occur. FIG. 6A and FIG. 6B illustrate the new problem. As illustrated in FIG. 6A, the DF output does not reach the DF output limit under a condition that a difference of the Ref value between before changing and after changing (ΔRef) is small and the DF output does not reach the DF output limit even if the Ref value is changed in a single stage. However, in this condition, the temperature convergence is accelerated when the Ref value is changed in a single stage as illustrated in FIG. 6B. Therefore, designation of the Ref value in stages does not always reduce the starting time because of a changing width of the Ref value or the number of the stages of changing the Ref value. Further, in the example of FIG. 5B, even if the Ref value is changed in three stages, the reduction of the temperature convergence time is not achieved when the Ref value is large and the DF output reaches the DF output limit.

A description will be given of a starting method of a semiconductor laser and a starting device of a semiconductor laser that are capable of reducing a time until a characteristic of the semiconductor laser is changed to a desirable one, in the following embodiments.

[First Embodiment]

Figure 7:
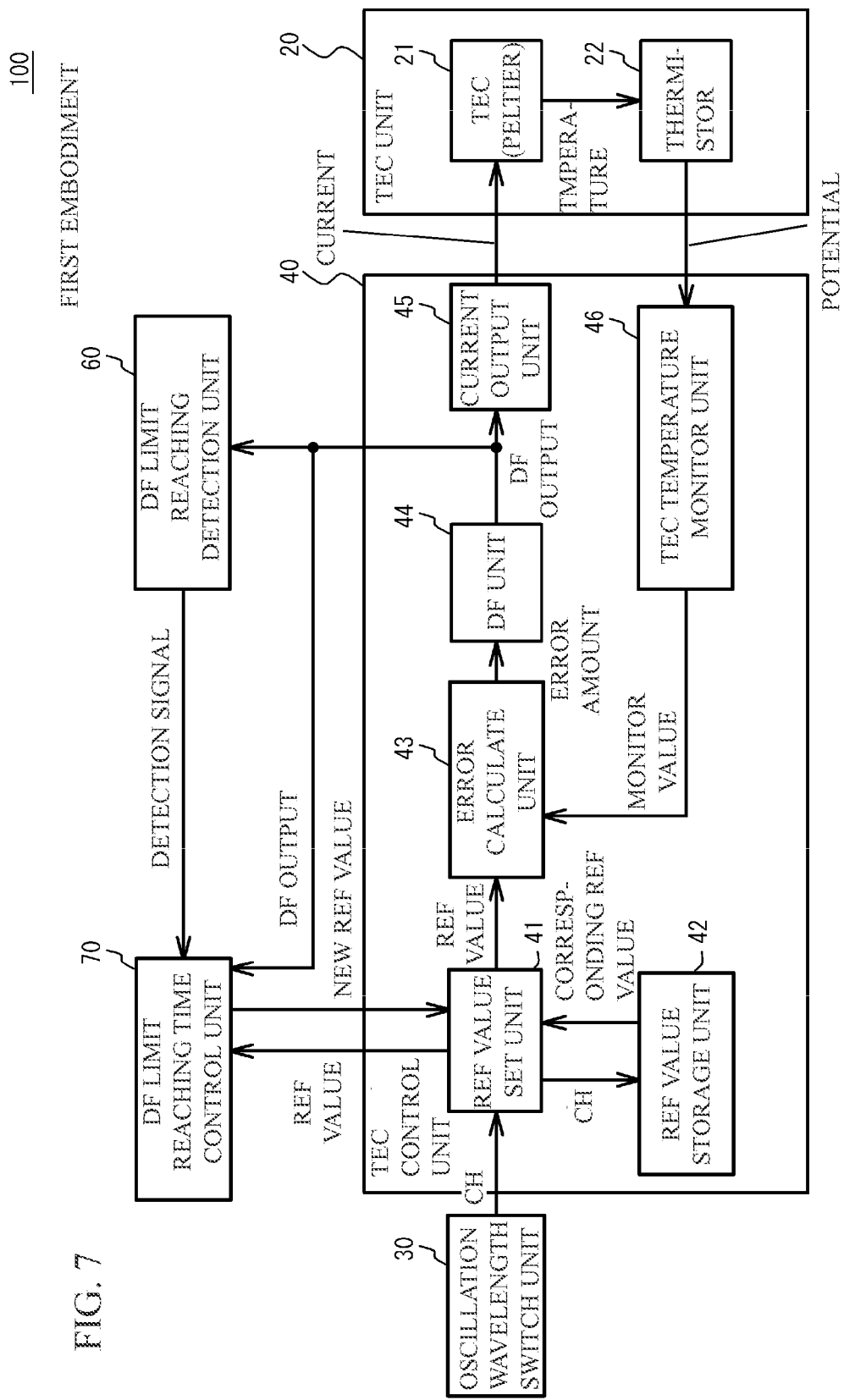
FIG. 7 illustrates a block diagram of a structure of a temperature control device of a semiconductor laser in accordance with a first embodiment.

FIG. 7 illustrates a block diagram of a structure of a temperature control device 100 of a semiconductor laser in accordance with a first embodiment. The temperature control device 100 is different from the temperature control device 300 of FIG. 2 in a point that a DF-limit-reaching detection unit 60 and a DF-limit-reaching-time control unit 70 are further provided. An explanation of the same structure is omitted by adding the same reference numeral.

Figure 8:
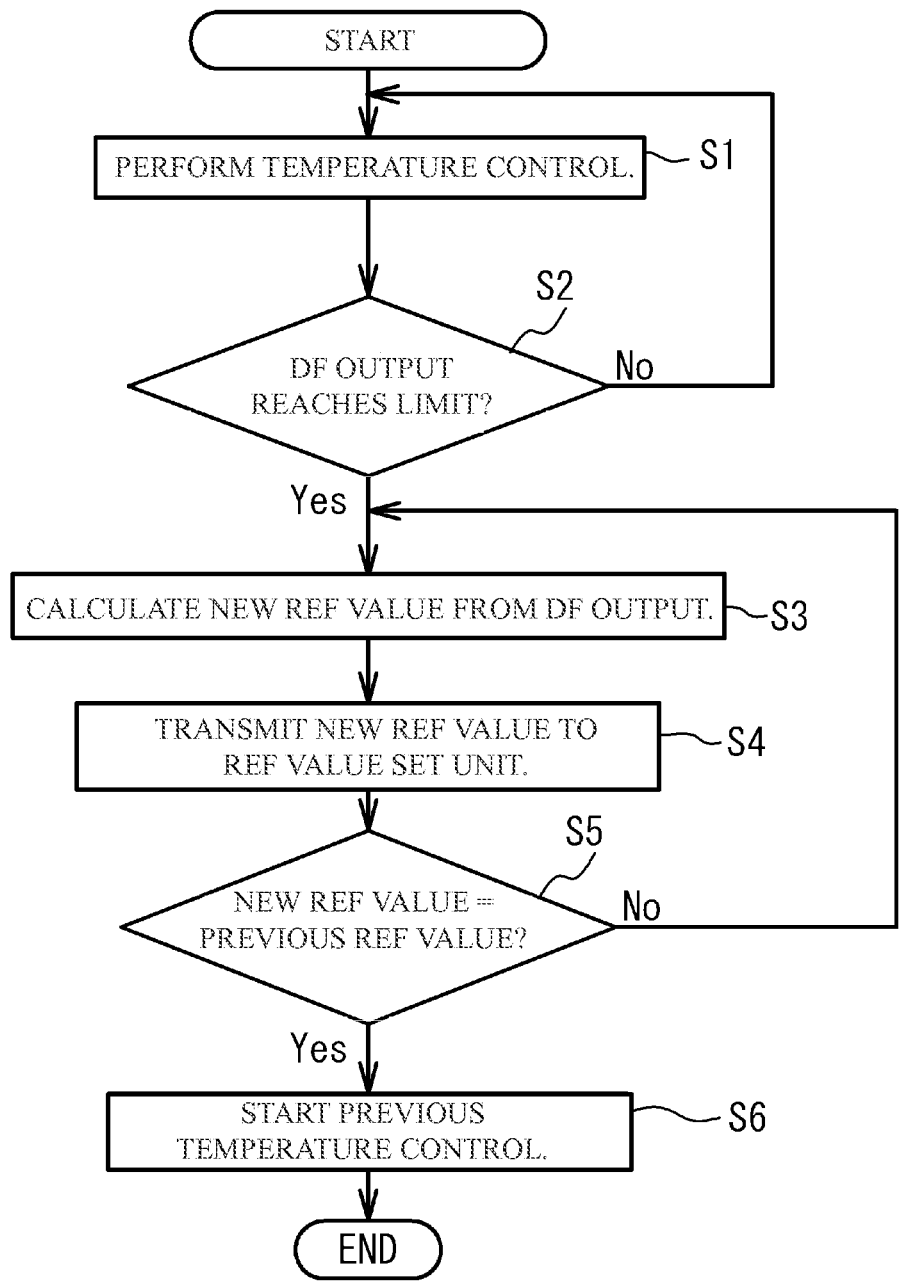
FIG. 8 illustrates a flowchart of an operation example of a temperature control device.

The DF-limit-reaching detection unit 60 receives a DF output from the DF unit 44 and outputs a detection signal to the DF-limit-reaching-time control unit 70 when the DF output reaches the DF output limit. The DF-limit-reaching-time control unit 70 outputs a new Ref value based on the detection signal from the DF-limit-reaching detection unit 60, the DF output from the DF unit 44 and the Ref value from the Ref value set unit 41. The new Ref value is a feedback control output so that the DF output remains at the DF output limit, in a case where the DF output is input. The Ref value set unit 41 starts a feedback control based on the new Ref value when receiving the new Ref value from the DF-limit-reaching-time control unit 70. That is, the TEC control unit 40 performs a control so that the DF output remains at the DF output limit by switching the control method when the DF output reaches the DF output limit FIG. 8 illustrates a flowchart of an operation example of the temperature control device 100. As illustrated in FIG. 8, when the oscillation wavelength switch unit 30 changes a setting wavelength channel, the TEC control unit 40 performs a temperature control of the TEC 21 (Step S1). The temperature control of the case is a feedback control for achieving the Ref value. Next, the DF-limit-reaching detection unit 60 determines whether the DF output reaches the DF output limit (Step S2). When it is determined as "No" in the Step S2, the Step S1 is executed again.

When it is determined as "Yes" in the Step S2, the DF-limit-reaching detection unit 60 outputs a detection signal, and the DF-limit-reaching-time control unit 70 calculates a new Ref value from the DF output that is output by the DF unit 44 (Step S3). Next, the DF-limit-reaching-time control unit 70 transmits the new Ref value calculated in the Step S3 to the Ref value set unit 41 (Step S4). Thus, a feedback control for achieving the new Ref value is performed. Next, the Ref value set unit 41 determines whether the new Ref value is equal to a previous Ref value (a Ref value before the DF output reaches the DF output limit) (Step S5). When it is determined as "No" in the Step S5, the Step S3 is executed again. When it is determined as "Yes" in the Step S5, the TEC control unit 40 changes the temperature control to a previous feedback control based on the previous Ref value (Step S6). Through the operation, the feedback control is performed so that the new Ref value is equal to the previous Ref value.

Figure 9:
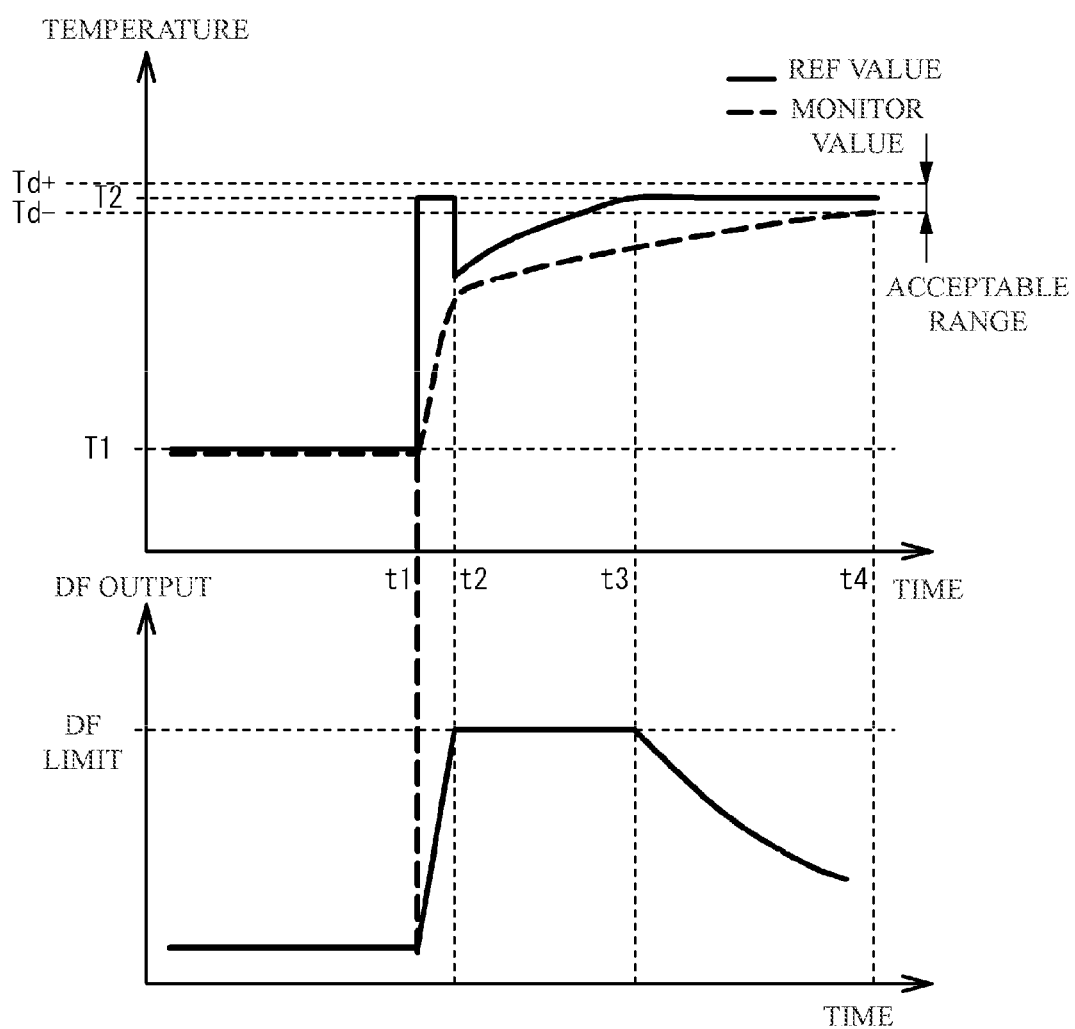
FIG. 9 includes a time axis and illustrates an aspect where a temperature control device performs a temperature control.

FIG. 9 includes a time axis, and illustrates an aspect where the temperature control device 100 performs the temperature control. As illustrated in FIG. 9, a target temperature is changed from T1 to T2 at t1. Thus, a feedback control is performed so that the temperature of the TEC 21 is equal to T2. The DF output reaches the DF output limit at t2. Therefore, a new Ref value is set so that the DF output remains at the DF output limit After that, the new Ref value is updated in order so the DF output remains at the DF output limit. When the new Ref value is equal to a previous Ref value, a feedback control is performed based on the previous Ref value.

In accordance with the first embodiment, when the DF output reaches the DF output limit, the DF output remains at the DF output limit Therefore, a reduction of the DF output is suppressed. Accordingly, the temperature control time of the semiconductor laser is reduced. The DF output remains at the DF output limit. Therefore, the semiconductor laser can be protected. A new driving circuit is not necessary. Therefore, a problem such as a cost up can be suppressed.

[Second Embodiment]

Figure 10:
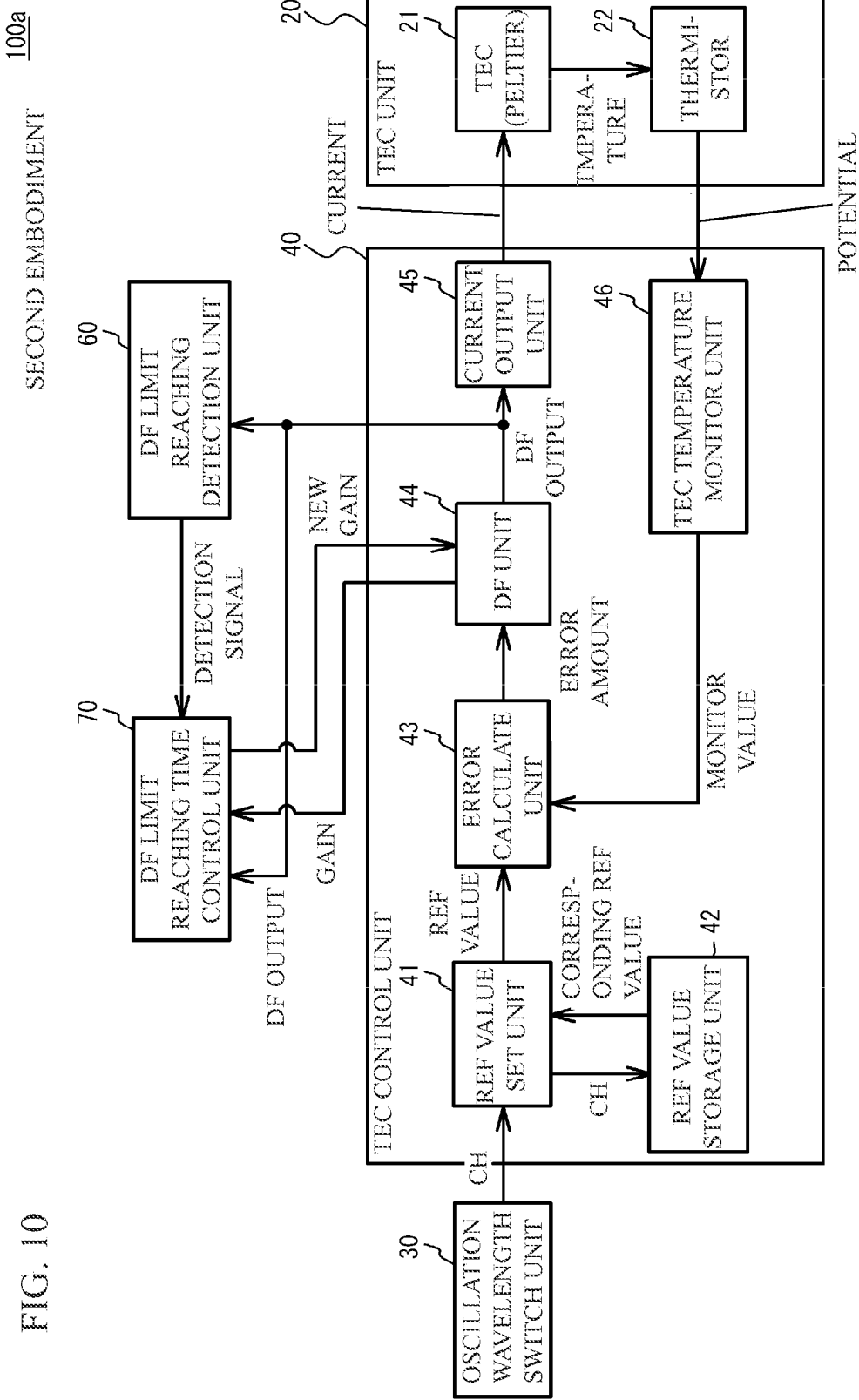
FIG. 10 illustrates a block diagram of a structure of a temperature control device of a semiconductor laser in accordance with a second embodiment.

FIG. 10 illustrates a block diagram of a structure of a temperature control device 100a of a semiconductor laser in accordance with a second embodiment. The temperature control device 100a is different from the temperature control device 100 of FIG. 7 in a point that the DF-limit-reaching-time control unit 70 does not change the Ref value of the Ref value set unit 41 but controls a gain of the DF unit 44.

As illustrated in FIG. 10, the DF-limit-reaching detection unit 60 receives a DF output from the DF unit 44 and outputs a detection signal to the DF-limit-reaching-time control unit 70 when the DF output reaches the DF output limit. The DF-limit-reaching-time control unit 70 outputs a new gain to the DF unit 44 based on the detection signal from the DF-limit-reaching detection unit 60, the DF output from the DF unit 44 and the gain of the DF unit 44. The new gain is a feedback control output so that the DF output remains the DF output limit, in a case where the gain of the DF unit 44 is input.

Figure 11:
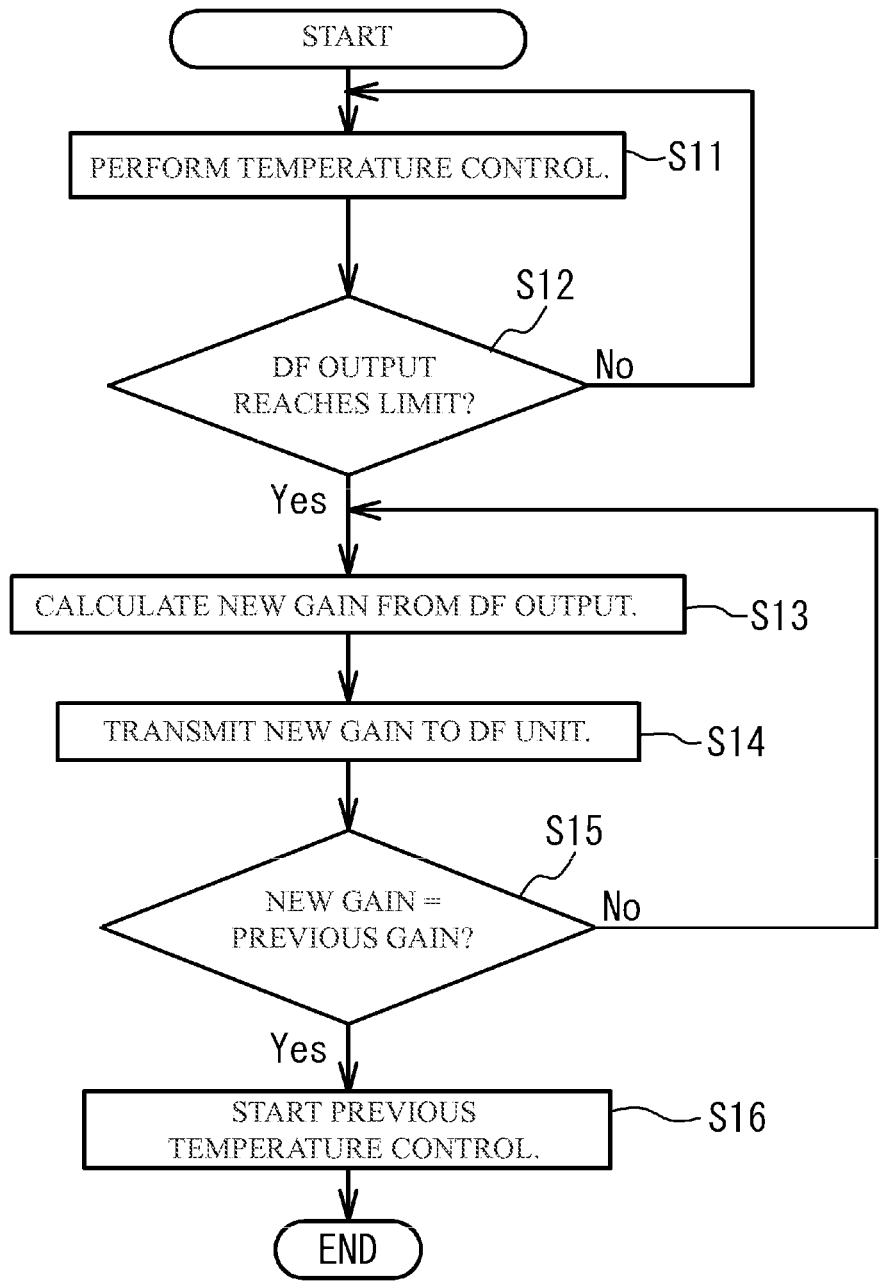
FIG. 11 illustrates a flowchart of an operation example of a temperature control device in accordance with a second embodiment.

A feedback control is performed based on the new gain when the DF unit 44 receives the new gain from the DF-limit-reaching-time control unit 70. That is, the TEC control unit 40 performs a control so that the DF output remains at the DF output limit by switching the control method when the DF output reaches the DF output limit FIG. 11 illustrates a flowchart of an operation example of the temperature control device 100*a*. As illustrated in FIG. 11, when the oscillation wavelength switch unit 30 changes a setting wavelength channel, the TEC control unit 40 performs a temperature control of the TEC 21 (Step S11). The temperature control of the case is a feedback control for achieving a Ref value. Next, the DF-limit-reaching detection unit 60 determines whether the DF output reaches the DF output limit (Step S12). When it is determined as "No" in the Step S12, the Step S11 is executed again.

When it is determined as "Yes" in the Step S12, the DF-limit-reaching detection unit 60 outputs a detection signal, and the DF-limit-reaching-time control unit 70 calculates a new gain from the DF output that is output by the DF unit 44 (Step S13). Next, the DF-limit-reaching-time control unit 70 transmits the new gain calculated in the Step S13 to the DF unit 44 (Step S14). Thus, a feedback control based on the new gain is started. Next, the DF unit 44 determines whether the new gain is equal to a previous gain (a gain before the DF output reaches the DF output limit) (Step S15). When it is determined as "No" in the Step S15, the Step S13 is executed again. When it is determined as "Yes" in the Step S15, the TEC control unit 40 changes the temperature control to a previous feedback control based on the previous gain (Step S16). Through the operation, the feedback control is performed so that the new gain is equal to the previous gain.

Figure 12:
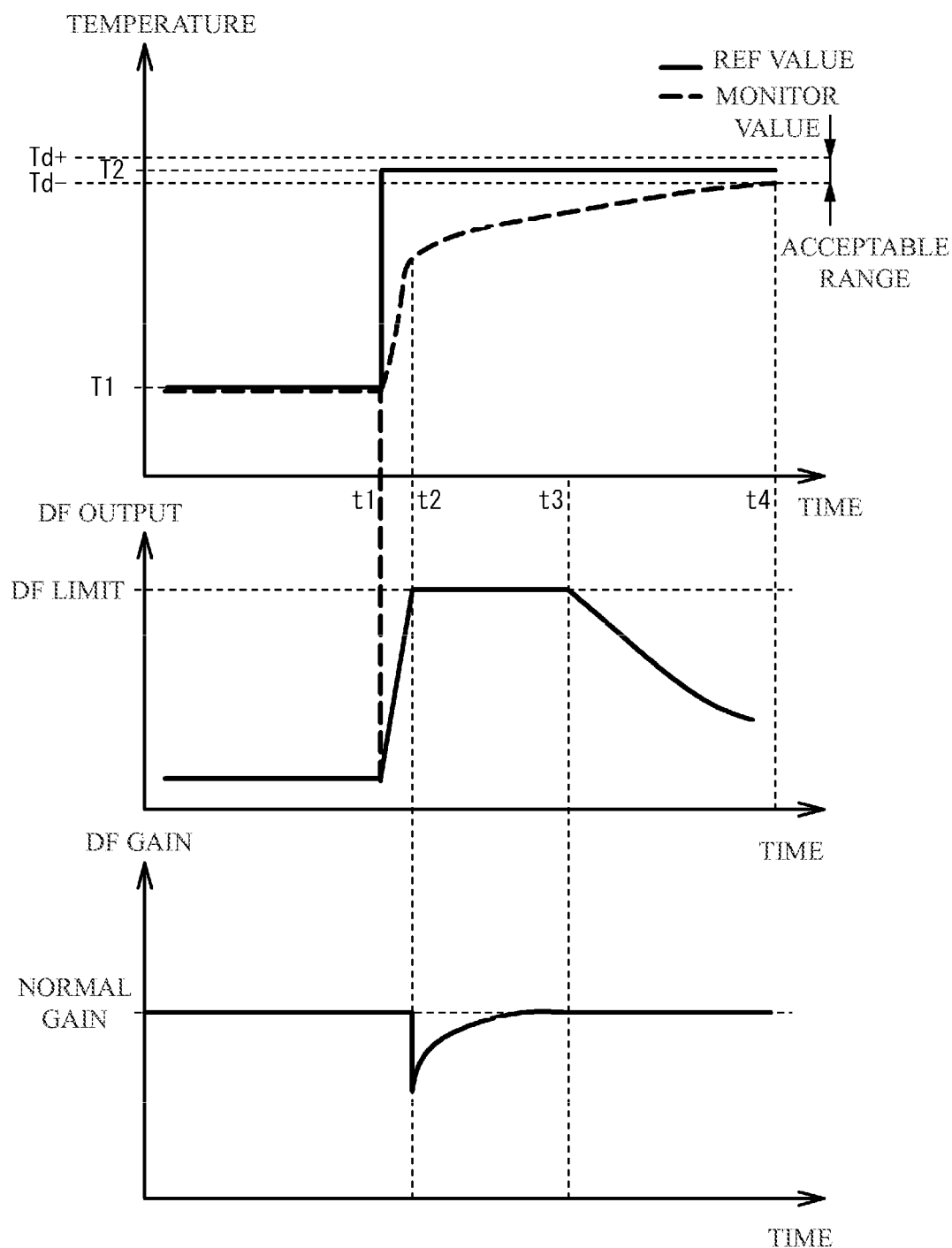
FIG. 12 includes a time axis and illustrates an aspect where a temperature control device in accordance with a second embodiment performs a temperature control.

FIG. 12 includes a time axis, and illustrates an aspect where the temperature control device 100*a* performs the temperature control. As illustrated in FIG. 12, a target temperature is changed from T1 to T2 at t1. Thus, a feedback control is performed so that the temperature of the TEC 21 is equal to T2. The DF output reaches the DF output limit at t2. Therefore, a new gain is set so that the DF output remains at the DF output limit After that, the new gain is updated in order so the DF output remains at the DF output limit. When the new gain is equal to a previous gain, a feedback control is performed based on the previous gain.

In accordance with the second embodiment, when the DF output reaches the DF output limit, the DF output remains at the DF output limit Therefore, a reduction of the DF output is suppressed. Accordingly, the temperature control time of the semiconductor laser is reduced. The DF output remains at the DF output limit Therefore, the semiconductor laser can be protected. A new driving circuit is not necessary. Therefore, a problem such as a cost up can be suppressed.

[Third Embodiment]

Figure 13:
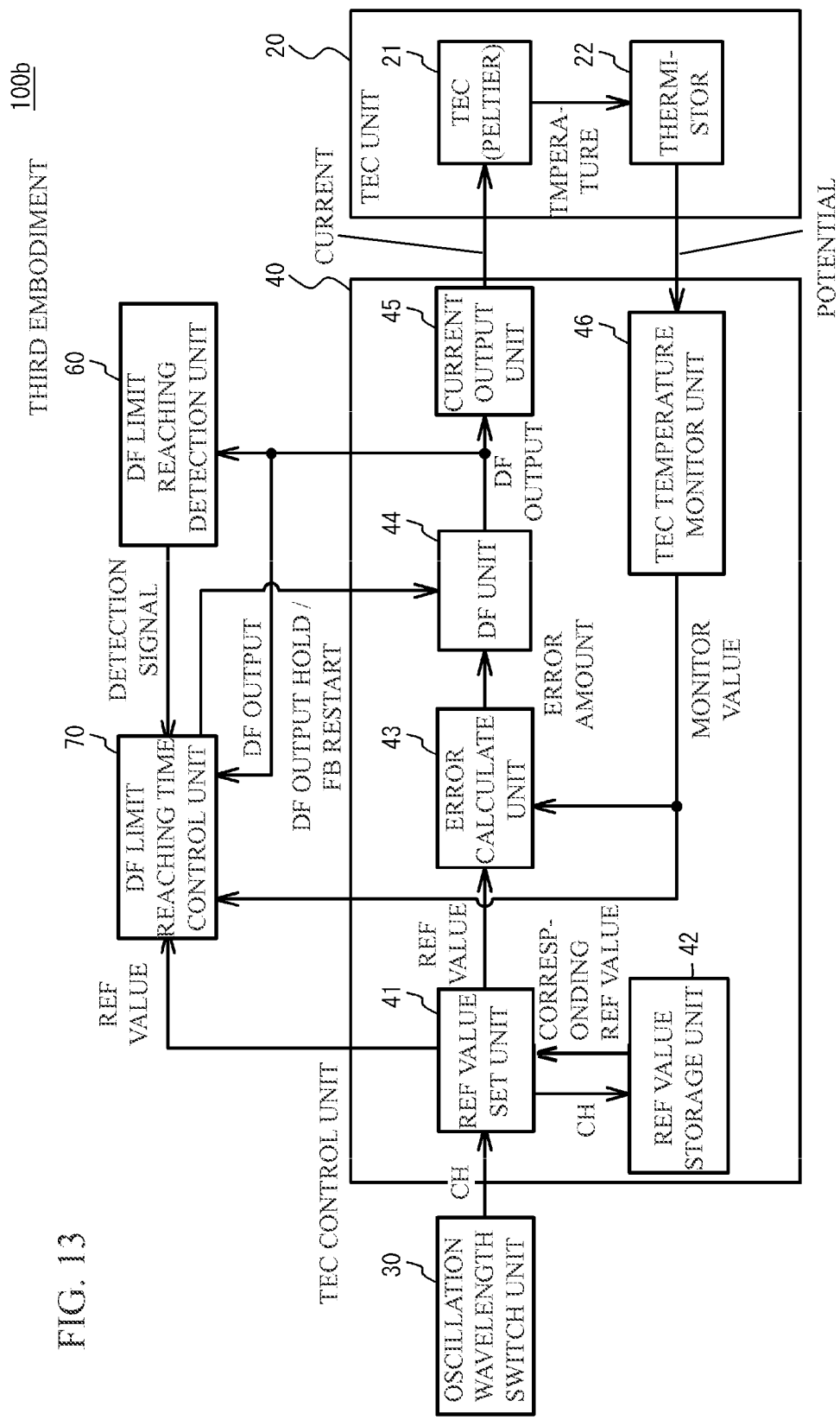
FIG. 13 illustrates a block diagram of a structure of a temperature control device of a semiconductor laser in accordance with a third embodiment.

FIG. 13 illustrates a block diagram of a structure of a temperature control device 100*b* of a semiconductor laser in accordance with a third embodiment. The temperature control device 100*b* is different from the temperature control device 100 of FIG. 7 in a point that a feed forward control is performed. As illustrated in FIG. 13, the DF-limit-reaching detection unit 60 receives a DF output from the DF unit 44 and outputs a detection signal to the DF-limit-reaching-time control unit 70 when the DF output reaches the DF output limit.

When the DF-limit-reaching-time control unit 70 receives the detection signal, the DF-limit-reaching time control unit 70 stops the feedback control once, holds the DF output, and starts a feed forward control. When the DF output is held, the DF-limit-reaching time control unit 70 monitors a monitor value. When the monitor value gets closer to the Ref value and reaches a predetermined temperature convergence range, the feedback control is started again. As mentioned above, the DF output is kept at the DF output limit by switching from the feedback control to the feed forward control, in contrast to the previous temperature control.

Figure 14:
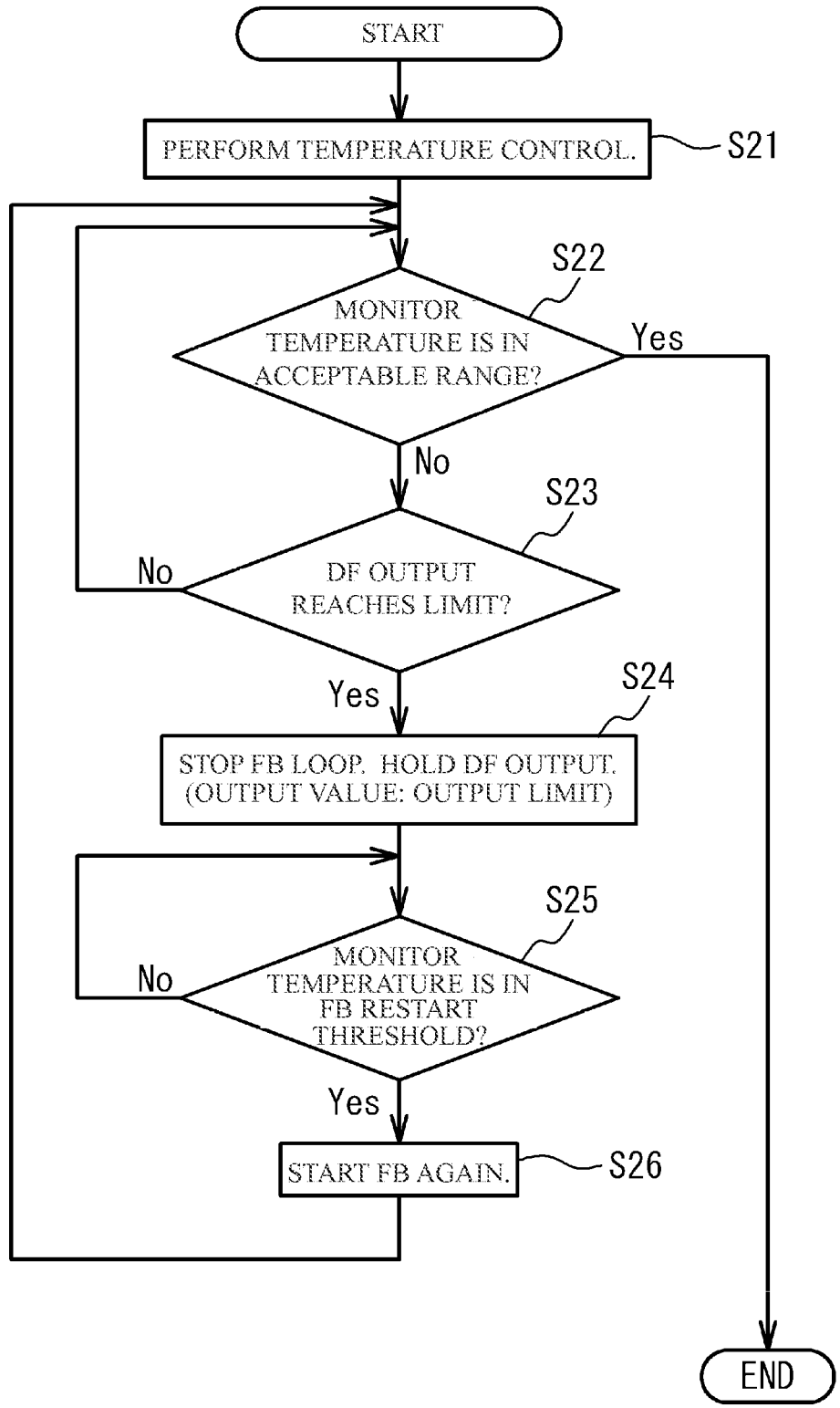
FIG. 14 illustrates a flowchart of an operation example of a temperature control device in accordance with a third embodiment.

FIG. 14 illustrates a flowchart of an operation example of the temperature control device 100*b*. As illustrated in FIG. 14, when the oscillation wavelength switch unit 30 changes a setting wavelength channel, the TEC control unit 40 performs a temperature control of the TEC 21 (Step S21). The temperature control of the case is a feedback control for achieving the Ref value. The DF-limit-reaching-time control unit 70 determines whether the monitor value from the TEC temperature monitor unit 46 is in an acceptable temperature convergence range based on the Ref value from the Ref value set unit 41 (Step S22). When it is determined as "Yes" in the Step S22, the flowchart is terminated.

When it is determined as "No" in the Step S22, the DF-limit-reaching detection unit 60 determines whether the DF output reaches the DF output limit (Step S23). When it is determined as "No" in the Step S23, the Step S22 is executed again. When it is determined as "Yes" in the Step S23, the DF-limit-reaching detection unit 60 outputs a detection signal, and the TEC control unit 40 stops a feedback loop, and holds the DF output by the DF unit 44 (Step S24). Next, the DF-limit-reaching-time control unit 70 determines whether the monitor value from the TEC temperature monitor unit 46 is in a feedback re-start threshold range (Step S25). A minus side feedback re-start threshold Trs− is smaller than a minus side threshold Td−, and a plus side feedback re-start threshold Trs+ is larger than a plus side threshold Td+. When it is determined as "No" in the Step S25, the Step S25 is executed again. When it is determined as "Yes" in the Step S25, the TEC control unit 40 restarts the feedback control (Step S26). After that, the Step S22 is executed again.

Figure 15:
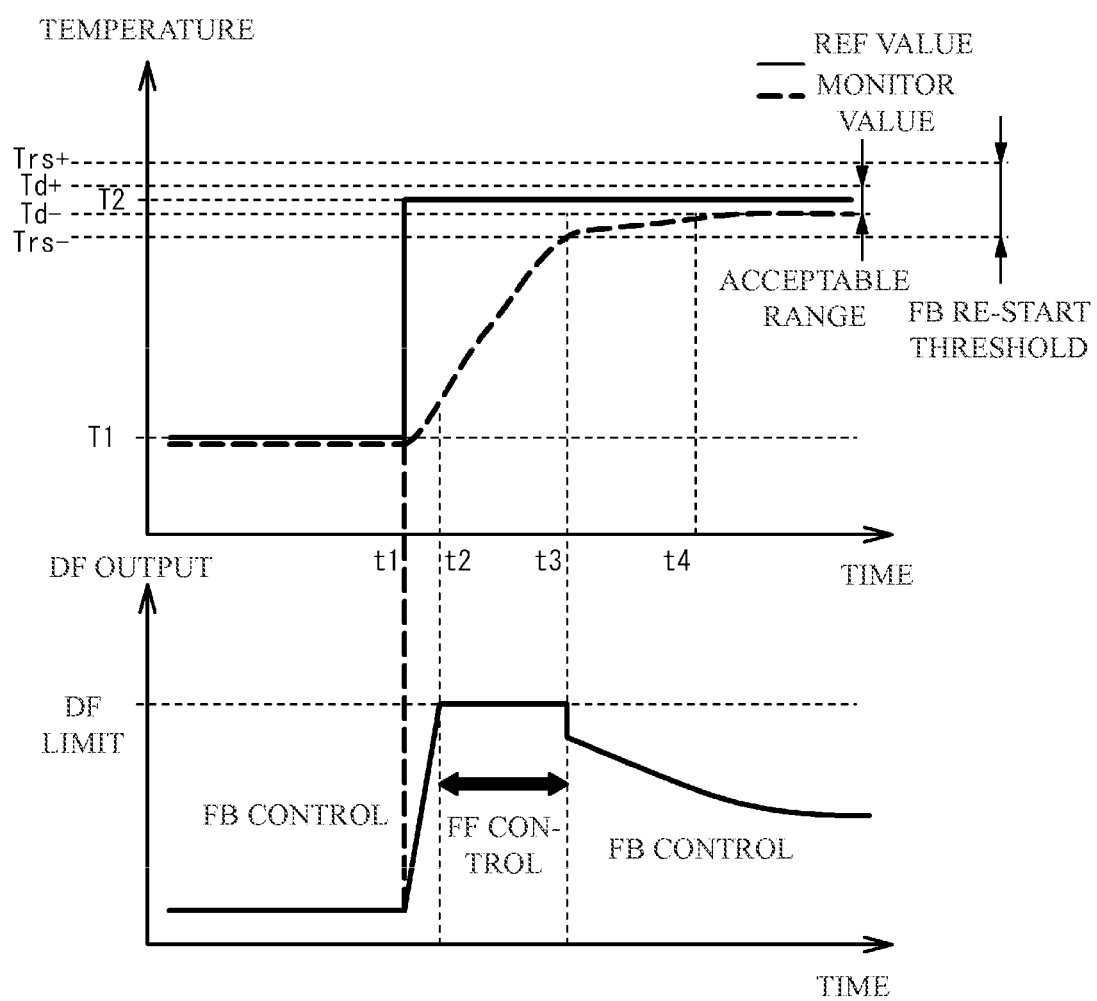
FIG. 15 includes a time axis and illustrates an aspect where a temperature control device in accordance with a third embodiment performs a temperature control.

FIG. 15 includes a time axis, and illustrates an aspect where the temperature control device 100*b* performs the temperature control. As illustrated in FIG. 15, a target temperature is changed from T1 to T2 at t1. Thus, a feedback control is performed so that the temperature of the TEC 21 is equal to T2. The DF output reaches the DF output limit at t2. Therefore, the control method is switched to the feed forward control so that the DF output remains at the DF output limit. The temperature of the TEC 21 reaches the feedback re-start threshold Trs− at t3. Therefore, the feedback control is started again.

In accordance with the third embodiment, when the DF output reaches the DF output limit, the DF output remains at the DF output limit Therefore, a reduction of the DF output is suppressed. Accordingly, it is possible to start the semiconductor laser at high speed. The DF output remains at the DF output limit Therefore, the semiconductor laser can be protected. A new driving circuit is not necessary. Therefore, a problem such as a cost up can be suppressed.

In the above-mentioned embodiments, when the DF output reaches the DF output limit, the control is performed so that the DF output remains at the DF output limit. However, the control is not limited. For example, a value less than the DF output limit may be a threshold. When the DF output reaches the threshold, a control is performed so that the DF output remains at the threshold. In this case, a reduction of the gain of the DF unit 44 is suppressed. Therefore, the temperature convergence time of the semiconductor laser 10 can be reduced. However, the temperature convergence time is more reduced when the DF output limit is a threshold. It is therefore preferable that the DF output limit is the threshold.

In the above-mentioned embodiments, the DF-limit-reaching detection unit 60 outputs a detection signal to the DF-limit-reaching-time control unit 70 when the DF output reaches the DF output limit. However, the process is not limited. For example, the DF-limit-reaching detection unit 60 may estimate that the DF output reaches the DF output limit based on the changing speed of the DF output (for example, a changing amount of every sampling cycle). The DF-limit-reaching detection unit 60 may output a detection signal when it is estimated that the DF output reaches the DF output limit.

Figure 16:
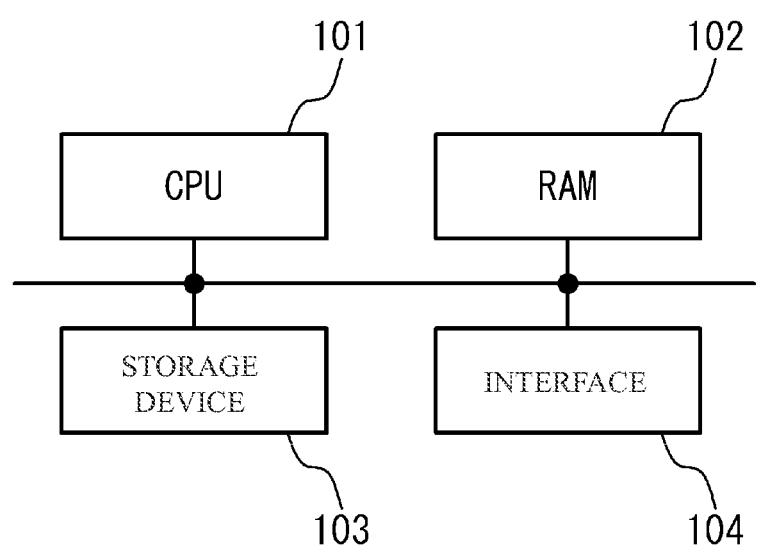
FIG. 16 illustrates a block diagram of a hardware structure for realizing each unit by a program.

The TEC control unit 40, the DF-limit-reaching detection unit 60 and the DF-limit-reaching time control unit 70 may be structured with a dedicated circuit or the like, and may be realized by a program. FIG. 16 illustrates a block diagram of a hardware structure for realizing each unit by a program. As illustrated in FIG. 16, a CPU 101, a RAM 102, a storage device 103, an interface 104 and so on may be provided. These components are connected via a bus or the like.

The CPU 101 is a Central Processing Unit. The CPU 101 includes one or more core. The RAM (Random Access Memory) 102 is a volatile memory for temporarily storing a program executed by the CPU 101, a data processed by the CPU 101 and so on. The storage device 103 is non-volatile storage device. A ROM (Read Only Memory), a solid state drive (SSD) such as a flash memory, a hard disk driven by a hard disk drive or the like can be used as the storage device 103. When the CPU 101 executes a predetermined program, the TEC control unit 40, the DF limit-reaching detection unit 60 and the DF limit-reaching time control unit 70 may be realized.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A method of controlling a temperature of a semiconductor laser comprising:
    detecting a temperature of a temperature control element;
    controlling a supply current so that a temperature of a temperature control element is changed to a target temperature, the temperature control element controlling a temperature of the semiconductor laser by a temperature changing according to the supply current supplied to the temperature control element; and
    performing a control for maintaining a calculated value calculated by a digital filter at a threshold when it is detected that the calculated value reaches the threshold even when a difference between the target temperature and the temperature detected by the detecting is changed, the calculated value being the supply current according to a difference between the target temperature and the temperature detected by the detecting, the threshold being equal to or less than an output limit of the digital filter.

2. The method as claimed in claim 1, wherein the threshold is the output limit of the digital filter.

3. The method as claimed in claim 1, wherein an input value to the digital filter is controlled so that the calculated value of the digital filter remains at the threshold.

4. The method as claimed in claim 1, wherein a gain of the digital filter is controlled so that the calculated value of the digital filter remains at the threshold.

5. The method as claimed in claim 1, wherein a feed forward control of the digital filter is performed so that the calculated value of the digital filter remains at the threshold.

6. The method as claimed in claim 1, wherein the calculated value is a calculated value for a temperature control of the temperature control element in which an output wavelength of the semiconductor laser is changed from a given wavelength to another wavelength.

7. The method as claimed in claim 1, wherein the digital filter is an Infinite Impulse Response filter.

8. A temperature control device of a semiconductor laser comprising:
    a temperature control element that controls a temperature of the semiconductor laser with use of a temperature changing according to a supply current supplied to the temperature control element;
    a detector that detects a temperature of the temperature control element;
    a control unit that controls the supply current so that the temperature of the temperature control element is changed to a target temperature,
    wherein:
    the control unit has a digital filter that calculates the supply current according to a difference between the target temperature and the temperature detected by the detector; and
    the control unit performs a control for maintaining a calculated value calculated by the digital filter at a threshold when it is detected that the calculated value reaches the threshold even when a difference between the target temperature and the temperature detected by the detector is changed, the threshold being equal to or less than an output limit of the digital filter.

9. The temperature control device as claimed in claim 8, wherein the threshold is the output limit of the digital filter.

10. The temperature control device as claimed in claim 8, wherein the control unit controls an input value to the digital filter so that the calculated value of the digital filter remains at the threshold.

11. The temperature control device as claimed in claim 8, wherein the control unit controls a gain of the digital filter so that the calculated value of the digital filter remains at the threshold.

12. The temperature control device as claimed in claim 8, wherein the control unit performs a feed forward control of the digital filter so that the calculated value of the digital filter remains at the threshold.

13. The temperature control device as claimed in claim 8, wherein the calculated value is a calculated value for a temperature control of the temperature control element in which an output wavelength of the semiconductor laser is changed from a given wavelength to another wavelength.

14. The temperature control device as claimed in claim 8, wherein the digital filter is an Infinite Impulse Response filter.

15. A non-transitory computer-readable medium storing a program that causes a computer to execute a process controlling a temperature of a semiconductor laser, the process comprising:
    detecting a temperature of a temperature control element by a sensor;
    controlling a supply current so that the temperature of the temperature control element is changed to a target temperature, the temperature control element controlling a temperature of the semiconductor laser by a temperature changing according to the supply current supplied to the temperature control element; and performing a control for maintaining a calculated value calculated by a digital filter at a threshold when it is detected that the calculated value reaches the threshold even when a difference between the target temperature and the temperature detected by the detecting is changed, the calculated value being the supply current according to a difference between the target temperature and the temperature detected by the detecting, the threshold being equal to or less than an output limit of the digital filter.

16. The medium as claimed in claim 15, wherein the threshold is the output limit of the digital filter.

17. The medium as claimed in claim 15, wherein an input value to the digital filter is controlled so that the calculated value of the digital filter remains at the threshold.

18. The medium as claimed in claim 15, wherein a gain of the digital filter is controlled so that the calculated value of the digital filter remains at the threshold.

19. The medium as claimed in claim 15, wherein a feed forward control of the digital filter is performed so that the calculated value of the digital filter remains at the threshold.

20. The medium as claimed in claim 15, wherein the calculated value is a calculated value for a temperature control of the temperature control element in which an output wavelength of the semiconductor laser is changed from a given wavelength to another wavelength.

21. The medium as claimed in claim 15, wherein the digital filter is an Infinite Impulse Response filter.

* * * * *